(12) United States Patent
Gartner et al.

(10) Patent No.: US 8,098,727 B2
(45) Date of Patent: Jan. 17, 2012

(54) METHOD AND DECODING DEVICE FOR DECODING CODED USER DATA

(75) Inventors: Martin Gartner, Ekolsund (SE); Herve Taddei, München (DE)

(73) Assignee: Siemens Enterprise Communications GmbH & Co. KG, Munich (DE)

( * ) Notice: Subject to any disclaimer, the term of this patent is extended or adjusted under 35 U.S.C. 154(b) by 1269 days.

(21) Appl. No.: 11/731,891

(22) Filed: Mar. 30, 2007

(65) Prior Publication Data

US 2007/0286276 A1   Dec. 13, 2007

(30) Foreign Application Priority Data

Mar. 30, 2006 (EP) .................................... 06006789

(51) Int. Cl.
*H04N 11/04* (2006.01)
(52) U.S. Cl. .................................. 375/240.01; 380/240
(58) Field of Classification Search ............. 375/240.01, 375/240.1; 382/233, 240, 241
See application file for complete search history.

(56) References Cited

U.S. PATENT DOCUMENTS

| | | | | |
|---|---|---|---|---|
| 6,597,750 B1 * | 7/2003 | Knutson et al. | ............... | 375/347 |
| 6,980,143 B2 * | 12/2005 | Linzmeier et al. | ............ | 341/143 |
| 6,993,198 B2 * | 1/2006 | Kishi | ............................ | 382/240 |
| 7,321,851 B2 | 1/2008 | Andrsen | | |
| 7,496,517 B2 * | 2/2009 | Sperschneider et al. | ...... | 704/501 |
| 7,516,230 B2 * | 4/2009 | Sperschneider et al. | ...... | 709/231 |
| 2001/0036321 A1 * | 11/2001 | Kishi | ............................ | 382/240 |
| 2002/0097807 A1 | 7/2002 | Gerrits | | |
| 2004/0049376 A1 * | 3/2004 | Sperschneider et al. | ... | 704/200.1 |
| 2005/0240414 A1 | 10/2005 | Tominaga | | |
| 2007/0208557 A1 * | 9/2007 | Li et al. | ...................... | 704/200.1 |
| 2007/0253481 A1 * | 11/2007 | Oshikiri | .................. | 375/240.12 |

FOREIGN PATENT DOCUMENTS

| WO | 2005/066937 A1 | 7/2005 |
|---|---|---|
| WO | 2005/106848 A1 | 11/2005 |

OTHER PUBLICATIONS

M. Zink et. al, "P2P Streaming Using Multiple Description Coded Video", EUROMICRO Conference, 2004, Proceedings 30$^{th}$ Rennes, France, Aug. 31-Sep. 3, 2004, Piscataway, NJ, USA, IEEE, Aug. 31, 2004, pp. 240-247, XP010723597.
H. Dong, et. al, "Speech Coding for Mobile Ad Hoc Networks", Institute of Electrical and Electronics Engineers, Conference Record of the 37$^{th}$ Asilomar Conference on Signals, Systems, & Computers, Pacific Groove, CA, Nov. 9-12, 2003, Asilomar Conference on Signals, Systems & Computers, NY, NY, IEEE, US, vol. 1 of 2, Conf. 37, Nov. 9, 2003, pp. 280-284, XP010701700.

(Continued)

*Primary Examiner* — Hadi Armouche (57) ABSTRACT

In on aspect, user data is decoded which has been coded as base data and refining data, wherein the base data is decoded using a first delay and the refining data is decoded using a second delay which is longer than the first delay. Furthermore, a check establishes whether the refining data is available in accordance with a time parameter. If the check result is positive, the decoded base data is additionally delayed, the additionally delayed decoded base data is mixed with the decoded refining data, and resulting mixed data is output as user data. If the check result is negative, however, the decoded base data is output as user data.

18 Claims, 3 Drawing Sheets

OTHER PUBLICATIONS

Chen Yingwei et al., "Channel Adaptive Prioritized Transmission of Layered Video Over Wireless LAN", Personal, Indoor and Mobile Radio Communications, 2003, PIMRC 2003, 14th IEEE Proceedings on Sep. 7-10, 2003, Piscataway, NJ, USA, IEEE vol. 2, Septmber 7, 2003, pp. 2948-2952, XP010678566, Abstract.

Zhang Rui et al., "Switched Error Concealment and Robust Coding Decisions in Scalablevideo Coding", Image processing, 2000, Proceedings, 2000 International Conference on Sep. 10-13, 2000, Piscataway, NJ, USA, IEEE, vol. 3, 10, Sep. 2000, pp. 380-383, XP010529483, Abstract.

H. Taddei et al., "A Scalable Three Bit-Rates 8-14.1-24 KGIT/S Audio Coder Codeur udio Hierarchique (8-14, 1-24 KTIB/S)", Annales Des Telecommunications—Annals of Telecommunications, Get Lavoisier, Paris, FR, vol. 55, No. 9/10, Sep. 2000, pp. 483-492, XP000968161.

P. Cuenca et al., "Packing Scheme for Layered Coding MPEG-2 Video Transmission Over ATM Based Networks", IEEE ATM Workshop 1997, Proceedings LISBOA, Portugal, May 25-28, 1997, New York, NY, USA, IEEE, US, May 25, 1997, pp. 168-177, XP010247401, Abstract.

P2P Streaming Using Multiple Description Coded Video by Michael Zink and Andreas Mauthe, Proceedings of the 30th Euromicro Conference.

Switched Error Concealment and Robust Coding Decisions in Scalable Video Coding by Rui Zhang, Shankar L. Regunathan and Kenneth Rose, Image Processing.

Channel Adaptive Prioritized Transmission of Layered Video over Wireless LAN by Yingwei Chen, Caries Ruiz Floriach, Jung Chul Ye and Kiran Challapali The 14th IEEE 2003 International Symposium on Personal, Indoor and Mobile Radio Communication Proceedings.

Speech Coding for Mobile Ad Hoc Networks by H. Don, I. D. Chakares, C. H. Lin, A. Gersho, E. Belding-Royer, U. Madhow, J. D. Gibson, Conference Record of the 37th Asilomar Conference on Signals, Systems & Computers, Pacific Groove, CA.

* cited by examiner

METHOD AND DECODING DEVICE FOR DECODING CODED USER DATA

CROSS REFERENCE TO RELATED APPLICATIONS

This application claims priority of European application No. 06006789.9 EP filed Mar. 30, 2006, which is incorporated by reference herein in its entirety.

FIELD OF INVENTION

The present invention relates to a method and decoding device for decoding coded user data.

BACKGROUND OF INVENTION

In digital communication systems, audio data, video data or other user data is usually transmitted in coded format. Provision is often made for compressing, by means of real-time or quasi-real-time coding methods, the user data that must be transmitted. In this case, it is usually preferable as far as possible to reduce the volume of data that must be transmitted, and hence a transmission rate, without overly compromising a subjective auditory impression in the case of audio transmissions, for example.

In particular, two classes of coding methods are known for coding audio and voice signals. The first relates to coding methods which act in the time domain, wherein a curve shape of the audio signal is coded or decoded with reference to the time, and the second relates to coding methods which act in the frequency domain, wherein a frequency-response characteristic of the audio signal is coded or decoded. Examples of coding methods in the time domain are the so-called CELP coding methods (Code Excited Linear Prediction). One example of a coding method in the frequency domain is the so-called AAC method (AAC: Advanced Audio Coding) of the Moving Picture Expert Group (MPEG), which uses a modified discrete cosine transformation. A further example of a coding method in the frequency domain is the so-called TDAC method (Time Domain Aliasing Cancellation).

Coding methods in the time domain are often known as "time domain coding" and coding methods in the frequency domain are often known as "frequency domain coding" or "transform coding".

The so-called "overlap-add method" is frequently used in frequency domain coding methods, whereby the user data from consecutive data packets is added using a predefined overlap.

In this context and in the following, data packets are understood to mean both data packets in the sense of a packet-oriented transmission, e.g. IP packets (IP: Internet Protocol), and so-called data frames.

SUMMARY OF INVENTION

The overlap-add method is advantageous insofar as it allows a reconstruction that is relatively true to the original of an audio signal which is coded by means of frequency data that is transmitted as packets. The overlap-add method corrects coding imperfections which are caused by a limited packet length or frame length.

It is however disadvantageous that, in order to decode a data packet definitively, it is necessary first to wait for the subsequent data packet in each case and include it in the decoding. The decoding delay increases significantly as a result of this. In the case of a packet length of 20 ms, for example, the decoding delay increases to 40 ms if the overlap-add method is used.

This increase in the decoding delay has a particularly disadvantageous effect on the frame error rate of VoIP applications (VoIP: Voice/Video over Internet Protocol). In the case of a VoIP application, provision is usually made for a maximal wait time during which a data packet is awaited. If an expected data packet does not arrive within this maximal wait time, this is usually interpreted as a packet loss. Such packet losses are particularly prevalent in communication networks having significant fluctuations in propagation time (jitter). In order to equalize such fluctuations in propagation time and thereby reduce the packet loss rate, provision can be made for an increased jitter buffer storage. As a result of an increased jitter buffer storage, however, the transmission delay is also increased, and this in turn has a negative effect on real-time properties of the audio transmission.

In the case of known decoding methods, if the maximal wait time is exceeded, a packet loss is assumed and a gap which is caused by the packet loss in the audio output stream is filled by lengthening and/or repeating one or more preceding audio packets or by estimating or extrapolating the missing audio packet. However, this is generally accompanied by an audible deterioration in the rendition quality.

The present invention addresses the problem of specifying a method for decoding coded user data, which method is less affected by propagation-time fluctuations of the user data. The invention also addresses the problem of specifying a decoding device for carrying out the method.

This problem is solved by a method and by a decoding device as described in the independent claims.

According to the invention, user data is decoded which has been coded as base data and refining data, wherein the base data is decoded using a decoder-related first delay and the refining data is decoded using a decoder-related second delay which is longer than the first delay. In particular, the user data can be voice data, audio data, video data or other communication data which must be transmitted in real time. The base data can be e.g. data codes which have been coded according to a CELP method. Data codes which have been coded according to the TDAC method can be used as refining data. In particular, the base data can be data codes which have been coded using a time domain coding method, and the refining data can be data codes which have been coded using a frequency domain coding method.

According to the invention, a check establishes whether the refining data is available in accordance with a time parameter. If the check result is positive, the decoded base data is additionally delayed, the additionally delayed decoded base data is mixed with the decoded refining data and the resulting mixed data is output as user data. If the check result is negative, however, the decoded base data is output as user data.

The decoding method according to the invention and the decoding device according to the invention are significantly less affected by propagation-time fluctuations of the coded user data than known decoding methods and decoding devices. If refining data arrives outside of the time parameter, in many cases no packet loss is assumed, but the decoded base data is output as user data instead. Although the decoded base data alone often features less fidelity of transmission than user data which is reconstructed on the basis of base data and refining data, the fidelity of transmission of the decoded base data is nonetheless usually considerably better than that of artificially generated compensation data as per known decoding methods.

Advantageous embodiments and developments of the invention are specified in the dependent claims.

According to an advantageous embodiment of the invention, refining data which is available outside of the time parameter can be buffered and used for decoding refining data and/or base data that arrives subsequently. In this way, refining data which arrived too late and could no longer be decoded at the appropriate time can be used in order to prepare or initiate the decoding operation of the subsequently arriving refining data and/or base data, or to be immediately available for the decoding thereof. In many cases, therefore, it is possible to ensure that a data packet of refining data which arrives too late only affects the decoding of this data packet and not also that of another data packet.

Until the arrival of the next refining data and/or base data, the decoded base data can be additionally delayed and the additionally delayed decoded base data can be output as user data. As a result of the additional delay, the base data can be decoded in conjunction with the next refining data and/or base data.

According to an advantageous embodiment of the invention, the base data and the refining data can arrive in data packets or data frames, wherein the decoding of the base data is packet-oriented and the decoding of refining data of a data packet takes place with reference to refining data of a further data packet.

It is additionally possible to ascertain a respective arrival time of the base data and/or the refining data and, depending on the arrival time which is ascertained, to switch between outputting the decoded base data and outputting the mixed data. In this way, propagation-time fluctuations of the base data and/or refining data can actively be equalized at least partially by means of switching. Instead of or in addition to a respective arrival time, it is also possible to ascertain a change tendency in the arrival times and, depending on the change tendency which is ascertained, to switch between the outputting of the decoded base data and the outputting of the mixed data.

In addition, the decoding of the base data and the decoding of the refining data can build on each other in accordance with a hierarchical decoding principle. In the case of hierarchical coding or decoding, a plurality of coding methods which are arranged in layers build on each other insofar as each superimposed layer refines a respective coding result of the layer below.

According to a development of the invention, provision can be made for a plurality of hierarchical levels of refining data which is decoded and delayed in a cascaded manner.

BRIEF DESCRIPTION OF THE DRAWINGS

Advantageous exemplary embodiments of the invention are explained in greater detail below with reference to the drawing.

Using a schematic illustration in each case.

DETAILED DESCRIPTION OF INVENTION

Figure 1:
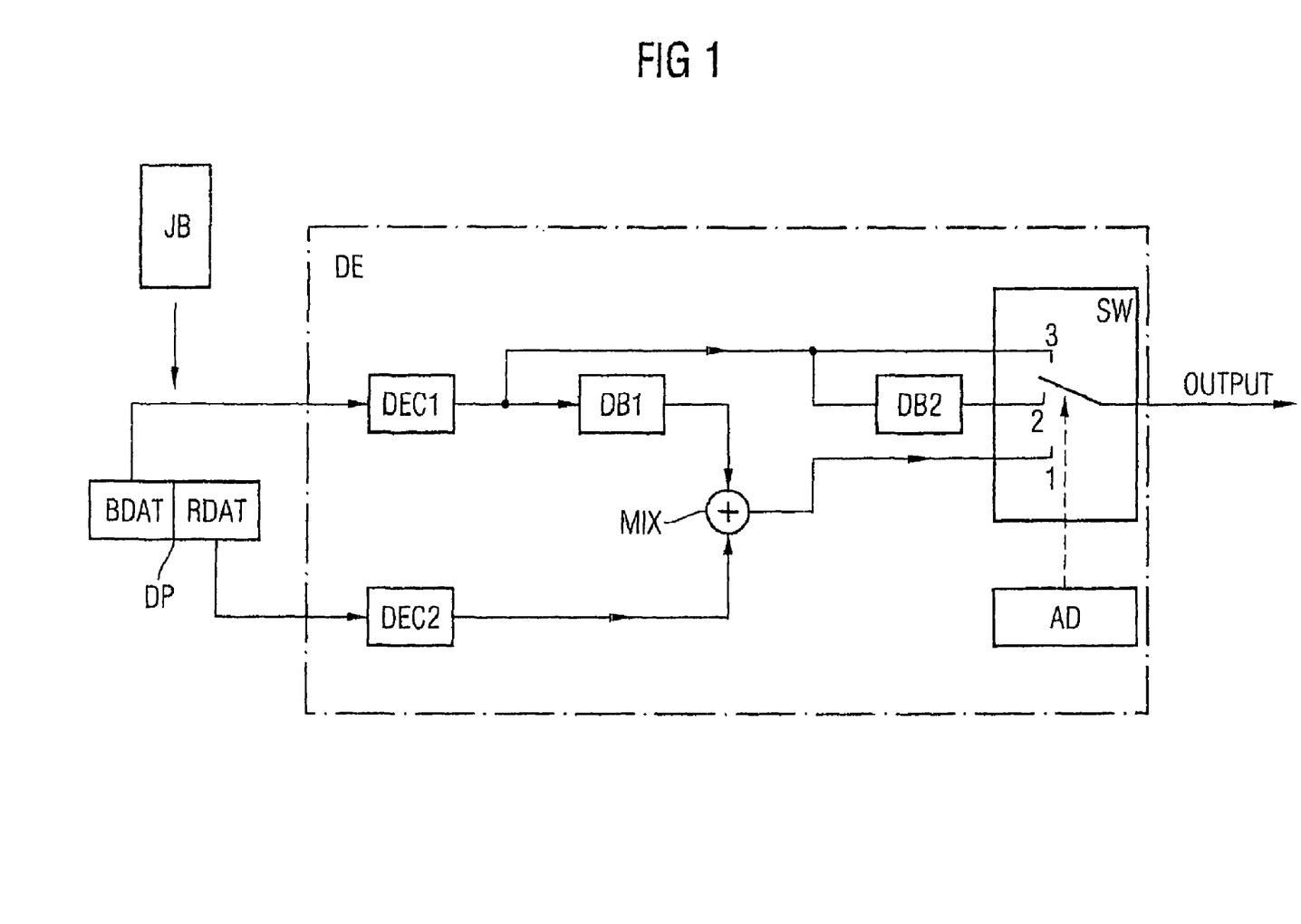
FIG. 1 shows a decoding device in accordance with the invention.

Using a schematic illustration, FIG. 1 shows a decoding device DE for decoding user data which is transmitted in data packets, e.g. IP packets. The user data can be audio data or voice data, for example, particularly in the context of real-time VoIP communication. The data packets, of which one data packet DP is illustrated by way of example in FIG. 1, are received via a packet-oriented communication network (not shown) such as the Internet, for example, and are therefore subject to certain propagation-time fluctuations. In order to equalize the propagation-time fluctuations, provision is made for a jitter buffer JB which is connected in advance of the decoding device DE as an input buffer storage. Data packets which are received from the communication network are temporarily stored in the jitter buffer JB and can be read out by the decoding device DE. The decoding device DE features a user data output OUTPUT, via which the decoded user data is output.

The decoding device DE implements a so-called hierarchical or scalable coding method in which a time domain coding method, e.g. in accordance with a CELP method, is combined with a frequency domain coding method, e.g. the TDAC method. The relevant frequency domain coding method builds hierarchically on the relevant time domain coding method insofar as a decoding result of the time domain coding method is refined by a decoding result of the frequency domain coding method. However, the coding result of the time domain coding method can be used without said result being refined by the frequency domain coding method, subject to slight quality losses.

For the purpose of the present exemplary embodiment, it is assumed that the decoding device DE features a decoder DEC1 which implements a CELP time domain coding method and a decoder DEC2 which implements the TDAC frequency domain coding method. The decoder DEC1 which operates in accordance with the CELP method makes use of broadband expansion techniques in the time domain and features a decoder-based algorithmic delay of e.g. 29 ms.

A decoder-based delay of a relevant decoder DEC1 or DEC2 is understood to mean the delay by which user data that is decoded by the decoder is delayed relative to the user data that is supplied to this decoder DEC1 or DEC2 respectively.

The decoder DEC2 which operates according to the TDAC method performs a Fourier transformation of the respective supplied user data and makes use of the so-called overlap-add method. The decoder DEC2 is therefore a so-called transform decoder.

The data packet DP contains coded user data comprising base data BDAT which is coded according to the CELP method and refining data RDAT which is coded according to the TDAC method. The refining data RDAT builds on the base data BDAT in the sense of a hierarchical coding. The base data BDAT is supplied to the decoder DEC1 and the refining data RDAT is supplied to the decoder DEC2. Both decoders DEC1 and DEC2 decode the respectively supplied user data BDAT or RDAT in parallel operation. While the decoder DEC1 can decode the base data BDAT which is contained in the data packet DP independently of base data which is contained in other data packets, the decoding of the refining data RDAT of the data packet DP additionally requires refining data of the subsequent data packet.

Due to the need for refining data of a subsequent data packet, the decoder-based delay of the decoder DEC2 is longer than the decoder-based delay of the decoder DEC1 by the frame length of a data packet, e.g. 20 ms. For the purpose of the present exemplary embodiment, it is assumed that the decoder-related delay of the decoder DEC2 is 29 ms+20 ms=49 ms accordingly.

Such a hierarchical arrangement of a CELP-based decoder, DEC1 in this case, and a TDAC-based decoder, DEC2 in this case, is currently being discussed in the context of the ITU-T recommendation G.729EV.

In known decoding devices, the relatively long delay of the decoder DEC2 would have a negative effect on the frame error rate of VoIP applications, since these applications only wait a predetermined time for a data packet containing coded user data and interpret an unsuccessful expiry of this maximal wait time as a packet loss. Decoders having a longer algorithmic delay result in a higher packet loss rate in networks which are subject to propagation-time fluctuations.

By contrast, even in the absence of refining data, the invention makes it possible in many cases nonetheless to output a user signal which is based on the base data and is of acceptable quality. Moreover, refining data which arrives too late can still be used in many cases to decode refining data which arrives subsequently and thus to limit any possible quality loss to one frame length.

In order at least partially to equalize the difference between the decoder-related delay of the decoder DEC1 and the decoder-related delay of the decoder DEC2, provision is made for a buffer storage DB1 whose input is coupled to an output of the decoder DEC1. The buffer storage DB1 delays the base data BDAT, which was decoded in the decoder DEC1, by the difference between the decoder-related delays of the decoders DEC1 and DEC2, i.e. by a frame length of the data packet DP (20 ms in this case).

The output of the buffer storage DB1 and an output of the decoder DEC2 are coupled to a mixing device MIX for mixing the decoded base data BDAT, which has been delayed by the buffer storage DB1, and the decoded refining data RDAT from the decoder DEC2. In normal operation, i.e. as long as the data packets containing the user data arrive at the appropriate time, the resulting mixed data is output as the decoded user data.

In order to illustrate the timing, consideration is given to the receipt of an Nth data packet containing coded user data. While the decoder DEC1 can decode the Nth data packet immediately, the decoder DEC2 can only decode the N-1th data packet on the basis of the Nth data packet. If the Nth data packet does not arrive at the appropriate time but is delayed by no more than one frame length (20 ms in this case), this Nth data packet which arrives too late can still be decoded at the appropriate time and output by the decoder DEC1.

The temporal relationship between the processing steps of the Nth data packet and subsequent data packets is clarified by the following table:

| Available data packet | N | N + 1 | N + 2 |
|---|---|---|---|
| Can be decoded by DEC1 | N | N + 1 | N + 2 |
| Output by DB1 | N − 1 | N | N + 1 |
| Can be decoded by DEC2 | N − 1 | N | N + 1 |
| Available at the OUTPUT | N − 1 | N | N + 1 |

In order to check the timely arrival of a relevant data packet DP, the decoding device DE features an availability detector AD. The availability detector AD checks whether a relevant data packet DP and therefore the refining data RDAT is available at the appropriate time, i.e. in accordance with a time parameter. Such a time parameter can be predetermined e.g. by real-time requirements of a VoIP application.

The availability detector AD is coupled to a switch device SW which has three switch positions 1, 2 and 3. Depending on the switch position 1, 2 or 3, different signals of the decoding device DE are switched through to the user data output OUTPUT. The switch position 1, 2 or 3 that is to be assumed in each case is controlled by the availability detector AD depending on the availability of the relevant data packet DP or the refining data RDAT.

The switch device SW connection interface which is assigned to the switch position 1 receives the resulting mixed data of the mixing device MIX. The switch device SW connection interface which is assigned to the switch position 3 is directly coupled to the output of the decoder DEC1. The switch device SW connection interface which is assigned to the switch position 2 is coupled to the output of the decoder DEC1 via a buffer storage DB2. The base data BDAT which has been decoded by the decoder DEC1 is delayed in the buffer storage DB2 by one frame length, i.e. 20 ms in this case.

As described above, the availability detector AD checks whether the refining data RDAT or the data packet DP is available at the appropriate time. If this is the case, i.e. following a positive check result, the switch device SW is set to the switch position 1, wherein the switch device SW switches the mixed data through to the user data output OUTPUT. If the refining data RDAT is not available at the appropriate time, i.e. following a negative check result, the switch device SW is set to the switch position 2 or 3. In the switch position 3, the switch device SW switches the base data BDAT which is decoded by the decoder DEC1 through to the user data output OUTPUT. In the switch position 2, the switch device SW switches the base data BDAT which has been decoded by the decoder DEC1 and additionally delayed by the buffer storage DB2 through to the user data output OUTPUT.

Figure 2:
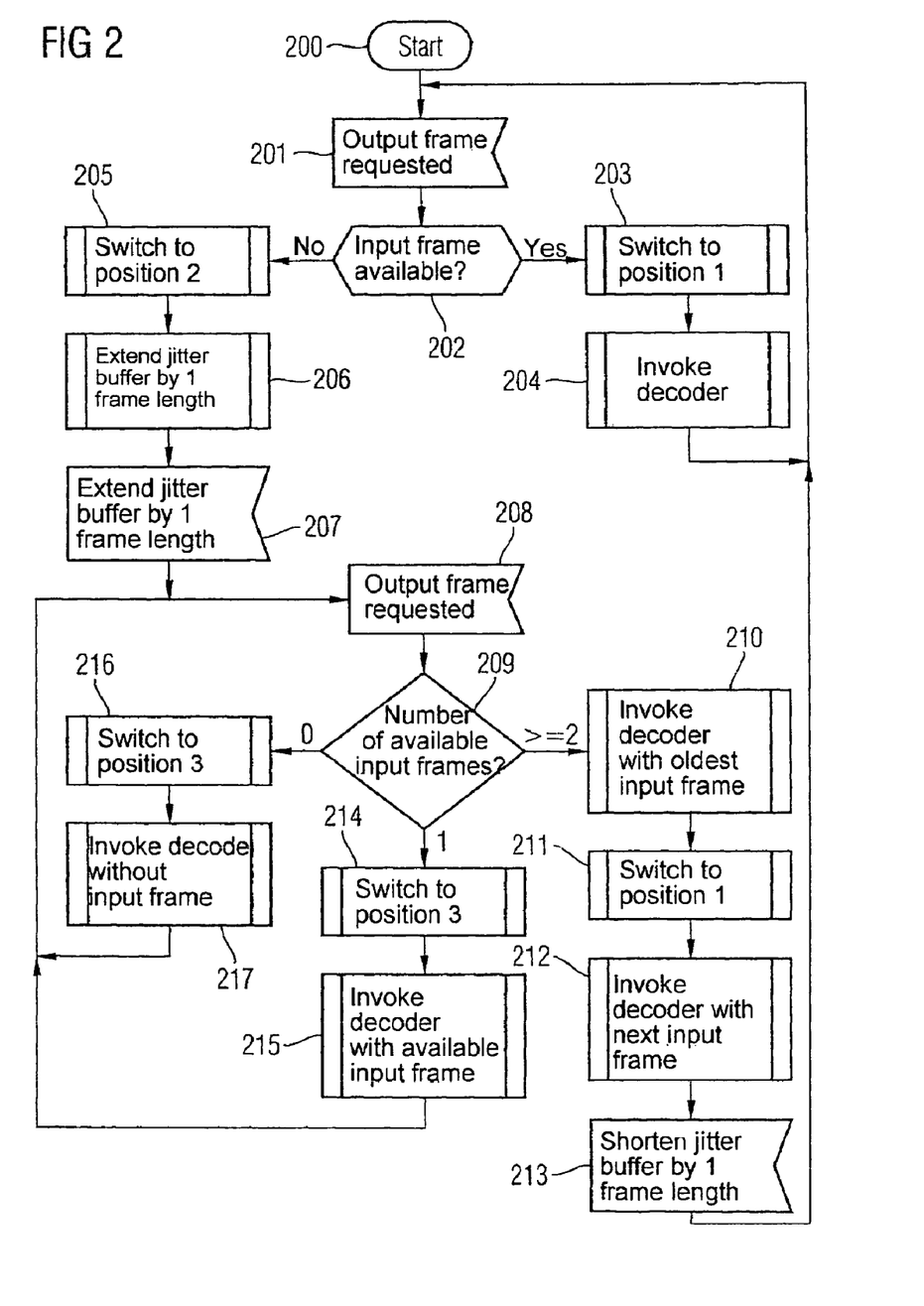
FIG. 2 shows a flow diagram in order to illustrate a decoding method according to the invention.

FIG. 2 shows a flow diagram in order to illustrate the method steps of the decoding method according to the invention.

Starting from the method start 200, in a method step 201 an output frame is requested at the user data output OUTPUT, e.g. by a VoIP application, with a specific time parameter. In the method step 202, the availability detector AD checks whether an input frame, i.e. a data packet DP, is currently readable and therefore available in the jitter buffer JB. If this is the case, the switch device SW is moved into the switch position 1 in a method step 203. In a method step 204, the decoders DEC1 and DEC2 are then invoked, i.e. instructed, to decode the base data BDAT or refining data RDAT contained in the data packet DP which is read out from the jitter buffer JB. This is followed by a return to the method step 201.

If it is established in the method step 202 that no input frame is currently available in the jitter buffer JB, the switch device SW is moved into the switch position 2 in a method step 205 and then an output frame is read out from the buffer storage DB2 and output via the user data output OUTPUT. In a method step 207, the jitter buffer JB is then extended by one frame length, i.e. by 20 ms in this case, such that an average delay of the jitter buffer JB increases by one frame length.

In a method step 208, an output frame is then requested again at the user data output OUTPUT. As a result of this, in a method step 209 the availability detector AD checks how many input frames, i.e. data packets DP, are currently readable and therefore available in the jitter buffer JB. If no input frames are available, the switch device SW is moved into the switch position 3 in a method step 216. The decoders DEC1 and DEC2 are then invoked without input frames. Since no data packet can be decoded in this case, a packet loss is assumed. In this case, known methods can be applied for bridging a user data gap that has occurred. Such methods are known as "frame erasure concealment". The method step 217 is followed by a return to the method step 208.

If the availability detector AD establishes in the method step 209 that exactly one input frame is available in the jitter buffer JB, in a method step 214 the switch device SW is moved into the switch position 3 and the decoder DEC1 is then invoked with the available base data BDAT of the input frame. The decoded base data BDAT is output directly via the user data output OUTPUT. This is followed by a return to the method step 208.

If the availability detector AD establishes that two or more input frames are currently available in the jitter buffer JB, the decoders DEC1 and DEC2 are invoked with the oldest available input frame in a method step 210, wherein the resulting decoding result is ignored. In a method step 211, the switch device SW is then moved into the switch position 1 and the decoders DEC1 and DEC2 are invoked with the next input frame in a method step 212. In the switch position 1, the resulting mixed data of the decoders DEC1 and DEC2 is output via the user data output OUTPUT. In a method step 213, the jitter buffer JB is then shortened by one frame length, i.e. 20 ms in this case, such that its average delay is reduced by one frame length. This is followed by a return to the method step 201.

As a result of the changeover, which is controlled by the availability detector AD, between outputting the mixed data and outputting the decoded base data BDAT, the invention provides an acceptable fallback solution for cases in which data packets containing coded user data arrive too late and would be discarded according to the prior art. The invention offers an improvement in the decoding quality and rendition quality relative to decoding methods in which data packets that do not arrive at an appropriate time are discarded. According to the invention, if a data packet does not arrive at the appropriate time, in many cases it is possible at least to use the base data BDAT for generating an acceptable user signal.

Furthermore, according to the invention, data packets which do not arrive at the appropriate time, particularly if these have not been delayed by more than one frame length with reference to the time parameter, are not discarded but are instead routed to the decoding device DE for decoding. In particular, the late arriving refining data RDAT of a delayed data packet DP is routed to the decoder DEC2 for decoding. Although such delayed refining data RDAT usually can no longer be output in decoded format at the appropriate time, this refining data RDAT can still be used to decode refining data from a subsequent data packet which arrives at the appropriate time. In this case, more refined quality of decoding is already possible for the subsequent data packet.

The invention can be configured and developed in many diverse ways.

For example, the decoder DEC2 can provide a particularly high-quality decoding given a correspondingly long decoder-related delay. In this case, provision can be made for detecting current real-time requirements of a communication application and, depending on said requirements, switching between the decoder DEC2 and the decoder DEC1 which has a shorter decoder-related delay.

Furthermore, if a sum of decoder-related delay and maximal jitter-related packet propagation time is limited, provision can be made for offsetting a higher jitter-related propagation time delay by switching over to the decoder DEC1 having the shorter decoder-related delay.

Instead of decoders which build on each other hierarchically, the decoders DEC1 and DEC2 can be implemented as decoders which are independent of each other. For example, the decoder DEC1 can be configured for decoding data packets having a frame length of 10 ms and the decoder DEC2 for decoding data packets having a frame length of 20 ms in a wider frequency band.

According to a development of the invention, provision can be made for a plurality of hierarchical levels of refining data which is decoded and delayed in a cascaded manner. Such a cascaded decoding device is illustrated in FIG. 3.

Figure 3:
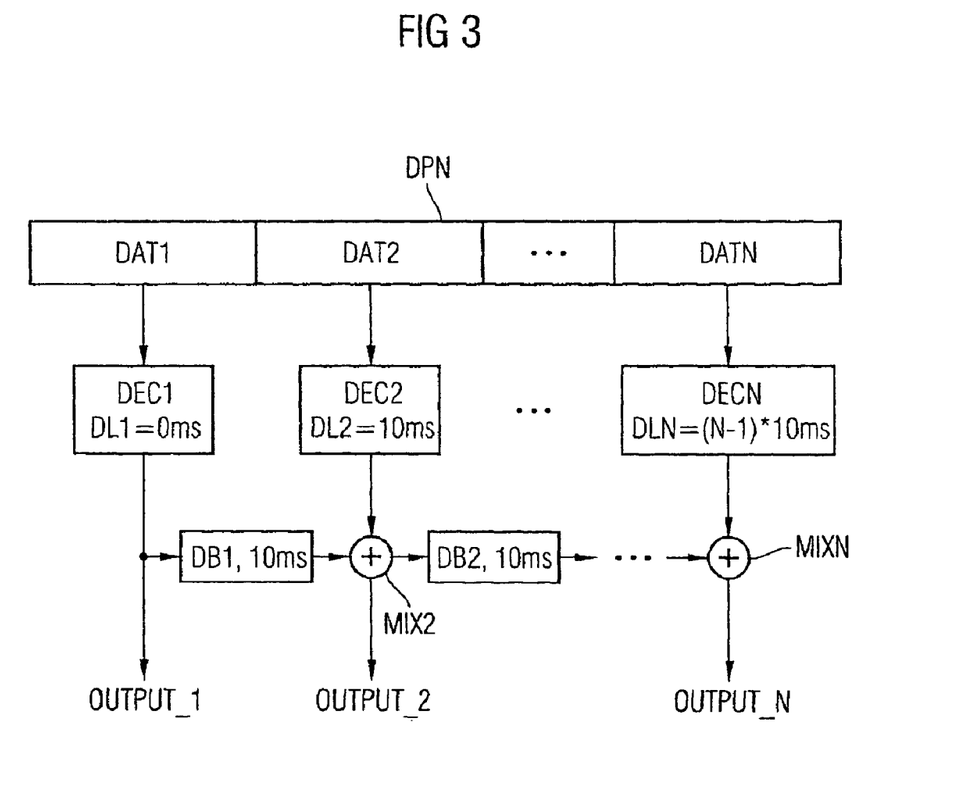
FIG. 3 shows a cascaded decoding device.

FIG. 3 shows a data packet DPN containing base data DAT1 and refining data DAT2, . . . , DATN which is in each case built hierarchically thereupon. Furthermore, provision is made for decoders DEC1, DEC2, . . . , DECN which are built hierarchically on each other and have different decoder-related delays. It is assumed that the decoder DEC1 has a decoder-related delay DL1 of 0 ms, the decoder DEC2 has a decoder-related delay DL2 of 10 ms and the decoder DECN has a decoder-related delay DLN of (N−1)*10 ms accordingly. Provision is further made for buffer storages DB1, DB2, . . . for at least partially equalizing the differences between the delays DL1, DL2, . . . , DLN as delay devices. In the present exemplary embodiment, the buffer storages DB1, DB2, . . . have a delay of 10 ms in each case. In addition, mixing devices MIX2, . . . , MIXN are coupled to an output of the decoders DEC2, . . . , DECN in each case.

The coded user data which is contained in the data packet DPN is supplied to the decoders DEC1, DEC2, . . . , DECN, specifically the base data DAT1 to the decoder DEC1, the refining data DAT2 to the decoder DEC2 and the refining data DATN to the decoder DECN accordingly. The decoder DEC1 decodes the base data DAT1 and outputs the decoded base data DAT1 via a signal output OUTPUT_1. The decoded base data DAT1 is also temporarily stored in the buffer storage DB1, where it is delayed by 10 ms, and the delayed decoded base data DAT1 is supplied to the mixing device MIX2.

The refining data DAT2 which is decoded by the decoder DEC2 using the delay DL2 is also supplied to the mixing device MIX2. The resulting mixed result is output by the mixing device MIX2 via a signal output OUTPUT_2 and is also supplied to the buffer storage DB2. The buffer storage DB2 delays the decoded refining data DAT2 by 10 ms and, if applicable, supplies the delayed decoded refining data DAT2 to a further mixing device which is arranged in a cascaded manner.

Finally, the refining data DATN which was decoded by the decoder DECN using the delay DLN, and the decoded refining data which was delayed by a pre-connected buffer storage, are supplied to the mixing device MIXN. The resulting mixed result is output via a signal output OUTPUT_N.

Successive refined decoded user data is consequently available at the signal outputs OUTPUT_1, OUTPUT_2, . . . , OUTPUT_N with various decoder-related delays. Depending on the temporal availability of the data packet DPN, or depending on specified real-time requirements, one of the signal outputs OUTPUT_1, OUTPUT_2, . . . , OUTPUT_N can be switched through to a user signal output of the decoding device.

The invention claimed is:

1. A method for decoding user data, comprising:
providing user data having a coded base data and a coded refining data;
decoding the base data using a first decoder having a decoder-related first delay;
decoding the refining data using a second decoder having a decoder-related second delay which is longer than the first delay;
checking whether the decoded refining data is available in accordance with a time parameter;
mixing the decoded refining data with the decoded base data and outputting the mixed data if the checking results in the refining data being available, the outputting of the mixed data occurring via a switch device communicatively connected to a mixing device to receive the mixed data from the mixing device when in a first position; and
outputting the decoded base data without any of the decoded refining data if the check results in the refining data being unavailable via the switch device, the switch device being communicatively connected to the first decoder and the switch device being in a second position when outputting the decoded base data without any of the decoded refining data.

2. The method of claim 1 wherein the refining data, which is available outside of the time parameter, is stored and used for decoding other refining data.

3. The method of claim 1 wherein the refining data, which is available outside of the time parameter, is stored and used for decoding other base data from other user data which arrives subsequently.

4. The method of claim 1 wherein the decoded base data is additionally delayed prior to the mixing of the decoded refining data and the decoded base data.

5. The method of claim 1 wherein the base data and the refining data arrive in data packets, wherein the decoding of the base data is packet-oriented, and wherein the decoding of refining data of a data packet takes place with reference to refining data of a further data packet.

6. The method of claim 1 further comprising ascertaining an arrival time of the base data or the refining data and adjusting the switch device to the first position or the second position depending on the ascertained arrival time of the base data or the refining data.

7. The method of claim 1 further comprising ascertaining an arrival time of the base data and the refining data and adjusting the switch device to the first position or the second position depending on the ascertained arrival time of the base data and the refining data.

8. The method of claim 1 further comprising adding a delay to the decoded base data before outputting the decoded base data if the check results in the refining data being unavailable.

9. The method of claim 1 wherein a plurality of hierarchical levels of refining data are decoded and delayed in a cascaded process.

10. A system for decoding user data comprising:
a storage unit;
a first decoder communicatively connected to the storage unit such that base data from at least one data packet stored in the storage unit is sendable from the storage unit to the first decoder for decoding of the base data;
a second decoder communicatively connected to the storage unit such that refining data from the at least one data packet stored in the storage unit is sendable from the storage unit to the second decoder for decoding, the second decoder having a decoder related delay that is greater than a decoder related delay of the first decoder;
a mixing device communicatively connected to the first decoder and the second decoder, the mixing device mixing decoded base data from the first decoder with decoded refining data from the second decoder to provide mixed data;
a switch device, the switch device communicatively connected to the mixing device to receive the mixed data from the mixing device when in a first position, the switch device being communicatively connected to the first decoder to receive decoded base data without any decoded refining data from the first decoder when in a second position; and
an availability detector communicatively connected to the switch device;
in response to receiving a first request for output having a time parameter, the availability detector checking the storage unit for whether the at least one data packet is available in the storage unit,
if the at least one data packet is available as required by the time parameter, the switch is placed in the first position such that the mixed data is provided to the switch device via the mixing device and is output from the switch device for responding to the first request for output; and
if another request for the output is received after receiving the first request for the output, the availability detector checking how many data packets are available in the storage unit,
if the availability detector determines that at least two data packets are available in the storage unit, the switch device being placed in the first position such that mixed base data and refining data is provided to the switch device via the mixing device and is output from the switch device, and
if the availability detector determines that one or zero data packets is available in the storage unit, the switch device being placed in the second position such that only base data is provided to the switch device via the first decoder and is output from the switch device.

11. The system of claim 10 further comprising a first buffer storage connected between the first decoder and the switch device, the first buffer storage delaying transmission of base data from the first decoder to the switch device when the switch device is in the second position.

12. The system of claim 10 further comprising a first buffer storage connected between the first decoder and the mixing device, the first buffer storage delaying transmission of base data from the first decoder to the mixing device.

13. The system of claim 12 further comprising:
a second buffer storage connected between the first decoder and the switch device, the second buffer storage delaying transmission of decoded base data from the first decoder to the switch device when the switch device is in a third position; and
if the availability detector checks the storage unit for whether the at least one data packet is available in the storage unit in response to receiving the first request for output and the availability detector determines that no data packet is available as required by the time parameter as a result of the checking of the storage unit, the switch device is positioned in the third position.

14. The system of claim 10 wherein the storage unit is a jitter buffer.

15. The system of claim 10 wherein the first decoder, second decoder, mixing device, switch device and availability detector are components of a decoding device that is connected to the storage unit.

16. A system for decoding user data comprising:
a first decoder communicatively connected to a storage unit such that base data from a data packet stored in the storage unit is sendable from the storage unit to the first decoder for decoding of the base data;
a second decoder communicatively connected to the storage unit such that refining data of the data packet stored in the storage unit is sendable from the storage unit to the second decoder for decoding, the second decoder having a decoder related delay that is greater than a decoder related delay of the first decoder;
a mixing device communicatively connected to the first decoder and the second decoder for mixing the decoded base data from the first decoder with the decoded refining data from the second decoder to provide mixed data;
a switch device, the switch device communicatively connected to the mixing device to receive the mixed data from the mixing device when in a first position, the switch device being communicatively connected to the first decoder to receive decoded base data without any decoded refining data from the first decoder when in a second position; and an availability detector communicatively connected to the switch device;

in response to receiving a first request for output having a time parameter, the availability detector checking the storage unit for whether the data packet is available in the storage unit,     if the data packet is available as required by the time parameter, the switch device is placed in the first position such that the mixed data is provided to the switch via the mixing device and is output from the switch for responding to the request for output, and     if the data packet is not available as required by the time parameter, the switch device is placed in the second position.

17. The system of claim 16 further comprising a first storage buffer positioned between the switch device and the first decoder such that decoded base data from the first decoder is sent to the first storage buffer before being sent to the switch device when the switch device is in the second position.

18. The system of claim 17 wherein:

if another request for the output is received after receiving the first request, the availability detector checking how many data packets are available in the storage unit,         if the availability detector determines that at least two data packets are available in the storage unit, the switch device being placed in the first position such that the mixed data is provided to the switch device via the mixing device and is output from the switch device, and         if the availability detector determines that one or zero data packets is available in the storage unit, the switch device being placed in a third position such that only decoded base data is provided to the switch device without passing through the first storage buffer via the first decoder for being outputted from the switch device.

\* \* \* \* \*